United States Patent [19]
Hawkins, II

[11] Patent Number: 5,014,015
[45] Date of Patent: May 7, 1991

[54] ULTRA-SHORT OPTICAL PULSE SOURCE

[75] Inventor: R. Thomas Hawkins, II, Aloha, Oreg.

[73] Assignee: Tektronix, Inc., Beaverton, Oreg.

[21] Appl. No.: 446,515

[22] Filed: Dec. 5, 1989

[51] Int. Cl.$^5$ .......................... G02B 27/44; G02F 1/16
[52] U.S. Cl. ...................................... 330/4.3; 372/21; 372/43
[58] Field of Search .......................... 350/96.13, 162.7; 330/4.3; 307/425, 430; 372/21, 43

[56] References Cited

U.S. PATENT DOCUMENTS 4,588,957  5/1986  Balart et al. .......................... 330/4.3
4,750,809  6/1988  Kafka et al. .................... 350/162.17

OTHER PUBLICATIONS

Agrawal et al.; "Amplification and compression . . . Amplifiers"; Opt. Lett., vol. 14, #10, pp. 500–502, 5/15/89; abst. only.
Hawkins et al.; "Energy Variations . . . Diode Lasers"; Opt. Soc. Am., 1/14/87, pp. 100–102, Confer. in NV; abst. only.
Damm et al.; "Compression of Picosecond. . . Fibers"; Opt. Lett., vol. 10, #4, pp. 176–178, 4/85; abst. only.
Franzer et al.; "Optical Sampling . . . Laser Diodes"; Electronics Lett., vol. 23, #6, pp. 289–290, 3/12/87; abst. only.

*Primary Examiner*—Nelson Moskowitz
*Attorney, Agent, or Firm*—Francis I. Gray

[57] ABSTRACT

An ultra-short optical pulse source uses a gain-switched laser diode with a dispersive delay line to compress the optical pulse output from the laser diode, the gain-switched laser diode having particular spectral characteristics. The gain-switched laser diode may be tested by energizing it with a continuous wave signal at or near the lasing threshold level. The resulting spectrum is examined for the presence of satellite spectral intensity features. Those gain-switched laser diodes that exhibit a spectrum having all satellite spectral features below a predetermined level with respect to the intensity of a principal spectral component are selected for use in the ultra-short optical pulse source.

6 Claims, 2 Drawing Sheets

ULTRA-SHORT OPTICAL PULSE SOURCE

BACKGROUND OF THE INVENTION

The present invention relates to optical pulse sources, and more particularly to an ultra-short optical pulse source having an output optical pulse width significantly less than ten picoseconds, the source using a gain-switched laser diode with a dispersive delay line. The gain-switched laser diode is selected for minimal satellite temporal pulses as determined by a spectral testing technique.

Short optical pulses are important in various test and measurement applications, including optical sampling and characterization of photodetector impulse response. Temporal resolution in such applications is ultimately limited by the optical pulse duration. For state of the art photodetector characterization and sampling measurements optical pulses with full width at half maximum intensity, $dt_{FWHM}$, of less than ten picoseconds are required. Sources of such optical pulses are readily available in laboratory environments, such as mode-locked dye and Nd:YAG lasers, but such sources are generally impractical for use in general test and measurement instrumentation because they are neither robust nor triggerable and have substantial size and power requirements.

For gain-switched diodes these problems are not an issue. Reproducible production of individual optical pulses with $dt_{FWHM} < 20$ ps has been demonstrated using such lasers with Fabry-Perot optical cavities. However production of such pulses having $dt_{FWHM}$ significantly less than ten picoseconds using Fabry-Perot diode lasers has not been reported, presumably due to parasitic reactances in both the diode laser and its package as well as the finite storage time of photons in the laser optical cavity. Takada et al have reported in the Journal of Lightwave Technology, Vol. LT-5, No. 10, October 1987 a method for producing diode laser pulses having $dt_{FWHM}$ of approximately six picoseconds with a gain-switched distributed feedback laser diode (DFB-LD) system. This technique is based on the use of a dispersive delay line to compress the pulsed output of such a laser.

Although the resulting pulses are short enough to be very interesting, assessment of the applicability of such pulses in test and measurement systems requires more detailed knowledge of the pulse temporal profile and pulse-to-pulse reproducibility. As a result of a series of detailed autocorrelation measurements of the dependence of the average optical pulse shape on the length of the fiber used for optical compression, two important shortcomings of the DFB-LD system were identified: pulse tails or satellite temporal pulses as shown in FIG. 1a, and low pulse energy. These two shortcomings are partially interrelated since greater than twenty percent of the pulse energy is located in the satellite temporal pulses. Since these pulse tails are quite long, greater than 40 picoseconds, and contain so much of the pulse energy, they are problematical for impulse excitation or optical sampling measurements, as is shown in FIG. 2 where the ideal pulse response of a photodetector is distorted as indicated by the dotted line.

What is desired is an ultra-short optical pulse source using a gain-switched dynamically single-mode laser diode system that minimizes satellite temporal pulses, and thus increases the pulse energy.

SUMMARY OF THE INVENTION

Accordingly the present invention provides an ultra-short optical pulse source of the type using a gain-switched dynamically singe-mode laser diode system, such as a distributed feedback laser diode (DFB-LD) or a distributed Bragg reflector laser diode (DBR-LD) system, the gain-switched laser diode being selected for minimal satellite temporal pulses using a spectral testing technique. The spectrum of the laser diode system driven to produce a single temporal pulse with maximum output energy is qualitatively reproduced by measuring the spectrum of the gain-switched laser diode when it is operated at or near threshold. Thus gain-switched laser diodes for pulse operation in a laser diode system can be selected using only continuous wave testing, which is much easier and less expensive than pulsed measurements.

The objects, advantages and other novel features of the present invention are apparent from the following detailed description when read in conjunction with the appended claims and attached drawing.

DESCRIPTION OF THE PREFERRED EMBODIMENT

Figure 3:
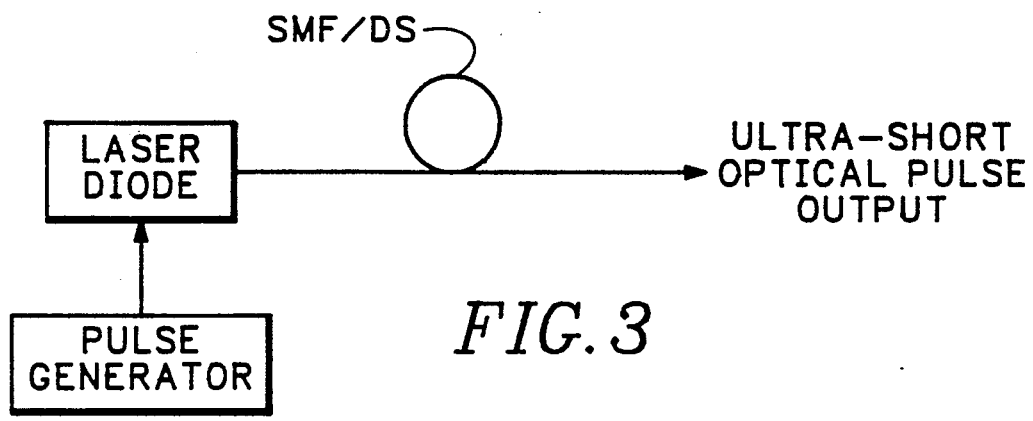
FIG. 3 is a block diagram of an ultra-short optical pulse source using a DFB-LD or DBR-LD system with the gain-switched laser being selected according to the present invention.

The output wavelength of a gain-switched laser diode shifts toward longer wavelengths during the intense portion of the pulse due to the reduction in carrier concentration associated with the optical emission. This shift, or chirp, for a gain-switched laser diode is approximately linear with time so that a suitable dispersive delay line, i.e., one that delays bluer wavelengths more than redder ones, may be used to create a superposition of the various wavelength components into a shorter pulse at the end of the delay line. Dispersion-shifted 1.5 um fiber has a dispersion of the correct sign for such a delay line at 1.3 um. Such a DFB-LD system ultra-short optical pulse source is shown in FIG. 3. However as stated above the resulting output pulse often has a satellite temporal pulse that is undesired.

Figure 1A:
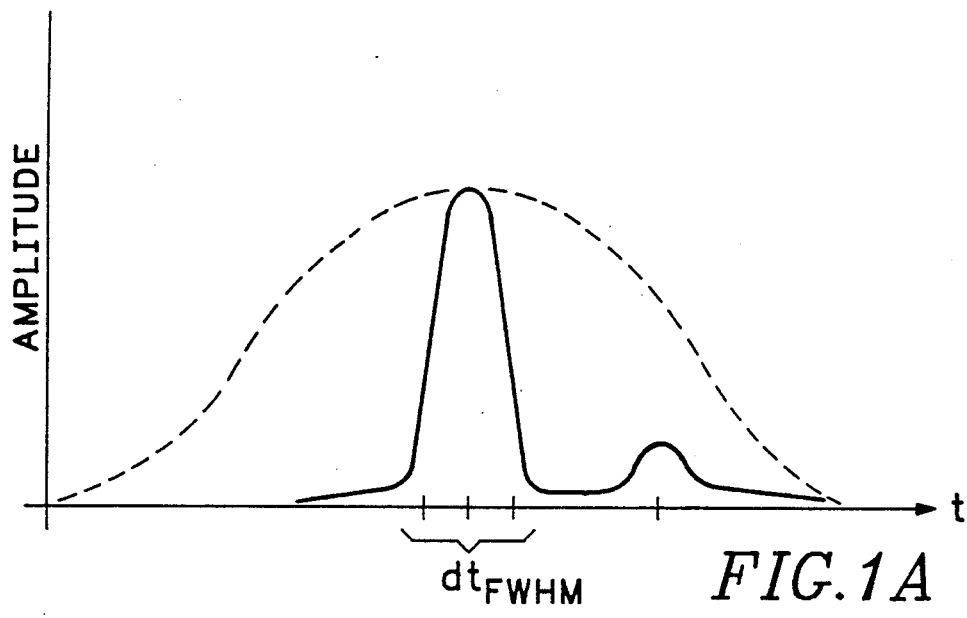
FIG. 1a is a temporal representation of an optical pulse generated by a DFB-LD system using dispersive compression.
Figure 1B:
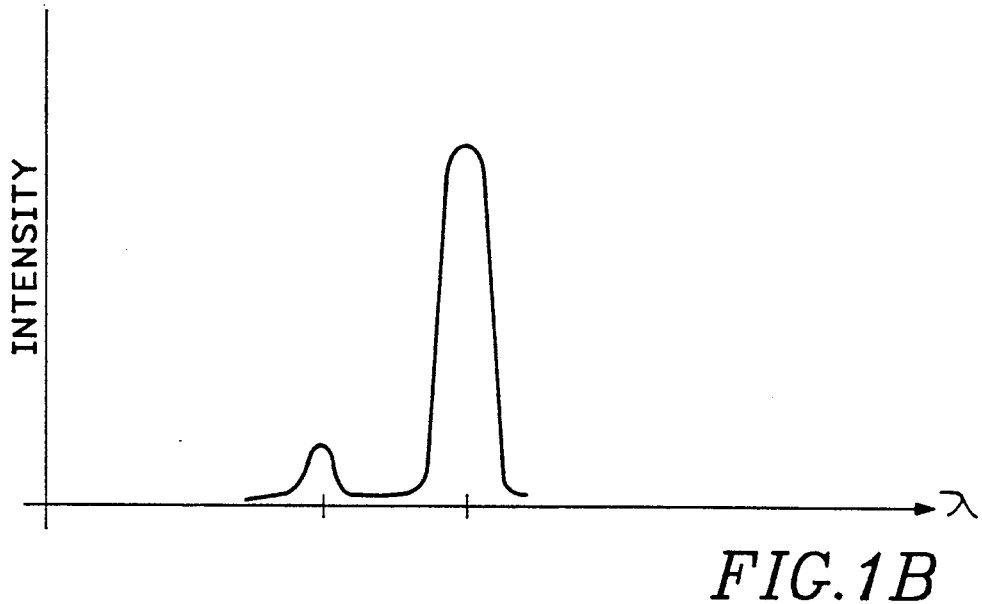
FIG. 1b is a spectral representation of the optical pulse generated by the gain-switched laser diode of the DFB-LD system.
Figure 2:
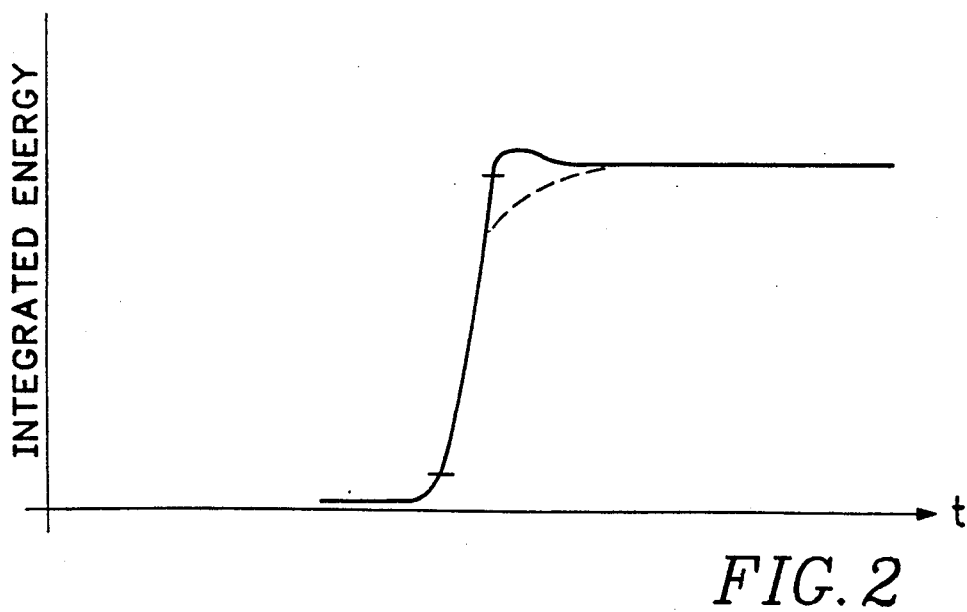
FIG. 2 is a temporal representation of a detected pulse edge by a photodetector of the optical pulse from the DFB-LD system

DFB or DBR laser diodes are manufactured with a regular grating built within the layered laser structure. The substrates are then scribed and broken to form the individual laser diodes. However there is no way of determining at what part of the grating the ends of the laser diode occur, resulting in variations in the characteristics from diode to diode. Although the satellite temporal pulse was originally deemed to be the result of the non-linearities at the ends of the chirp region of the laser diodes, it was determined by experimentation that the satellite temporal pulse is caused by satellite spectral emission nodes in the laser diode's spectral characteristic, as shown in FIG. 1b. When tested at full intensity, these satellite features are not apparent; but when tested in a pulse mode, the spectrum qualitatively approaches that of the laser diode at a threshold or slightly below threshold level of continuous wave excitation. These spectral modes are separated temporally by the fiber dispersion, and the satellite temporal pulses become apparent.

Figure 4:
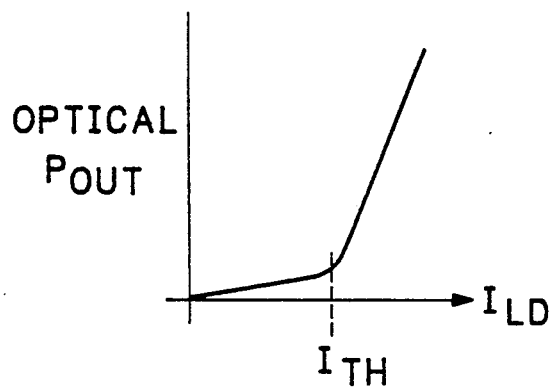
FIG. 4 is a typical output power vs. injected current diagram for a laser diode.

Therefore to find a gain-switched laser diode that is suitable for test and measurement applications, the laser diode needs to be tested to determine the amplitude of any satellite spectral features. The desired relationship is that any time-averaged satellite spectral intensity feature is greater than 20 dB below the peak intensity of a principal spectral component. Testing for this satellite spectral pulse in the pulse mode may be accomplished, but it is a rather long process. A more advantageous testing mode is to use a continuous wave (cw) signal that is at or near the threshold current, $I_{th}$, for the laser diode, as shown in FIG. 4. Such cw testing produces a spectrum that is qualitatively similar to the pulsed spectrum. By carefully selecting the laser diodes, ones may be found that produce pulses of less than three picoseconds $dt_{FWHM}$ when compressed in a laser diode system as described above.

Thus the present invention provides an ultra-short optical pulse source by selecting an appropriate dynamically single-mode laser diode for use in an optical pulse source system according to its spectrum to eliminate satellite temporal pulses, the testing preferably being done with a cw signal at or near the lasing threshold of the laser diode.

What is claimed is:

1. An ultra-short optical pulse source comprising:
    a gain-switched laser diode to produce an output optical pulse, the gain-switched laser diode having all time-averaged satellite spectral intensity features at least twenty decibels below the peak intensity of a principal spectral component; and
    means for dispersively delaying the output optical pulse to produce an ultra-short optical pulse without a satellite temporal pulse.

2. An ultra-short optical pulse source as recited in claim 1 wherein the main-switched laser diode is a distributed feedback laser diode.

3. An ultra-short optical pulse source as recited in claim 1 wherein the gain-switched laser diode is a distributed Bragg reflector laser diode.

4. An ultra-short optical pulse source comprising:
    a gain-switched laser diode for producing an output optical pulse, the gain-switched laser diode being selected to have all time-averaged satellite intensity features at a specified intensity level below the intensity level of a principal spectral component; and
    means for dispersively delaying the output optical pulse to produce an ultra-short optical pulse, the ultra-short optical pulse having no appreciable satellite temporal pulses.

5. An ultra-short optical pulse source as recited in claim 4 Wherein the gain-switched laser diode is selected by examining a spectrum for the gain-switched laser diode when energized by a continuous wave energy signal having an amplitude essentially at the lasing threshold for the gain-switched laser diode.

6. A method for selecting a laser diode for use in an ultra-short optical pulse source comprising the steps of:
    energizing the laser diode with a continuous wave signal having an energy level essentially at the lasing threshold for the laser diode; and
    examining a resulting spectrum for the laser diode to determine whether all satellite spectral intensity features are less than a predetermined fraction of the peak intensity of a principal spectral energy component, the laser diode having such a characteristic being selected for use in the ultra-short optical pulse source.

* * * * *